(12) United States Patent
Chen et al.

(10) Patent No.: US 9,374,038 B2
(45) Date of Patent: Jun. 21, 2016

(54) PHASE FREQUENCY DETECTOR CIRCUIT

(71) Applicant: TAIWAN SEMICONDUCTOR MANUFACTURING COMPANY, LTD., Hsinchu (TW)

(72) Inventors: Yen-Jen Chen, Taipei (TW); I-Ting Lee, Hsinchu (TW); Feng Wei Kuo, Zhudong Township (TW); Huan-Neng Chen, Taichung (TW); Chewn-Pu Jou, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 370 days.

(21) Appl. No.: 14/133,982

(22) Filed: Dec. 19, 2013

(65) Prior Publication Data
US 2014/0103961 A1  Apr. 17, 2014

Related U.S. Application Data

(63) Continuation of application No. 13/308,274, filed on Nov. 30, 2011, now Pat. No. 8,643,402.

(51) Int. Cl.
*H03D 13/00* (2006.01)
*H03L 7/087* (2006.01)
*H03L 7/089* (2006.01)
*H03L 7/10* (2006.01)

(52) U.S. Cl.
CPC ............. *H03D 13/00* (2013.01); *H03D 13/004* (2013.01); *H03L 7/087* (2013.01); *H03L 7/089* (2013.01); *H03L 7/10* (2013.01)

(58) Field of Classification Search
CPC ...................................................... H03D 13/00
See application file for complete search history.

(56) References Cited

U.S. PATENT DOCUMENTS

| 5,963,059 | A  | 10/1999 | Partovi et al. |
| 6,259,754 | B1 | 7/2001  | Jeong |
| 6,590,427 | B2 | 7/2003  | Murray et al. |
| 6,771,096 | B1 * | 8/2004 | Meyers ................ G01R 25/005 327/156 |
| 7,053,666 | B2 | 5/2006  | Tak et al. |
| 7,388,408 | B2 | 6/2008  | Liu et al. |
| 7,940,088 | B1 | 5/2011  | Sampath et al. |

OTHER PUBLICATIONS

Mansuri, Mozhgan et al., "Fast Frequency Acquisition Phase-Frequency Detectors for GSa/s Phase-Locked Loops", University of California at Los Angeles, Stanford University, 4 pages, Sep. 2001.

* cited by examiner

*Primary Examiner* — Hai L Nguyen
(74) *Attorney, Agent, or Firm* — Hauptman Ham, LLP

(57) ABSTRACT

A phase frequency detector circuit includes an edge detector circuit, a plurality of phase frequency detector sub-circuits, and a decision circuit. The edge detector circuit is configured to receive a first input signal and a second input signal. The decision circuit is configured to detect whether a blind condition exits based on outputs of the edge detector circuit and outputs of the plurality of phase frequency detector sub-circuits. Responsive to a result of the decision circuit, a corresponding frequency detector sub-circuit of the plurality of phase frequency detector sub-circuit is configured to provide signals for use in determining a phase difference between the first input signal and the second input signal.

20 Claims, 11 Drawing Sheets

PHASE FREQUENCY DETECTOR CIRCUIT

PRIORITY CLAIM

The present application is a continuation of U.S. application Ser. No. 13/308,274, filed Nov. 30, 2011, now U.S. Pat. No. 8,643,402 B2 issued on Feb. 4, 2014, which is incorporated by reference herein in its entirety.

FIELD

The present disclosure is related to a phase-frequency detector circuit.

BACKGROUND

A phase-locked loop (PLL) is commonly used in transceivers. The PLL generates an output signal having a phase related to the phase of an input reference signal. Locking time of the PLL is a specification in the time-division duplex (TDD) applications, such as the time division synchronous (TD-SCDMA) third generation mobile telecommunication (3G), worldwide interoperability for microwave access (WiMAX), etc.

A "blind" condition occurs in a circuit when some input edges of the circuit are close to or overlap each other. As a result, some output edges of the circuit cannot be generated. Alternatively stated, the output edge is missed. In a phase frequency detector (PFD) that has a blind condition, the PLL usually has a longer lock time. In some conditions, such as in high frequency applications of the PLL, the time interval of the reference signal is not much larger than the turn-on pulse used to turn on the charge pump in the PLL. As a result, a blind condition occurs. Decreasing the width of the turn-on pulse does not eliminate the blind condition in all circumstances.

In a synthesizer having a high output frequency, increasing the frequency of the reference signal of the PLL can improve the performance of the phase noise. Increasing the reference frequency, however, increases the chance for the blind condition to occur, which, in many situations, causes a longer lock time or even a failure to lock.

In an approach, a blind condition occurs in the PLL when the end of the period of the reference clock signal is close to the turn-on pulse. As a result, the reset signal of the PFD causes a blind condition. The lock time of the PLL may be longer than expected due to the blind condition.

In another approach, even if there is not a blind condition, the gain of the PFD is not linear during some phase errors. Further, without appropriate circuitry, the circuit to detect the missing clock edge may inaccurately reveal the presence of the missing edge when the phase and the frequency difference between the reference clock and the feedback clock are relatively small.

In another approach, when the phase difference is larger than a predefined value, the blind condition occurs. Additionally, during some phase differences, the gain is flat.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
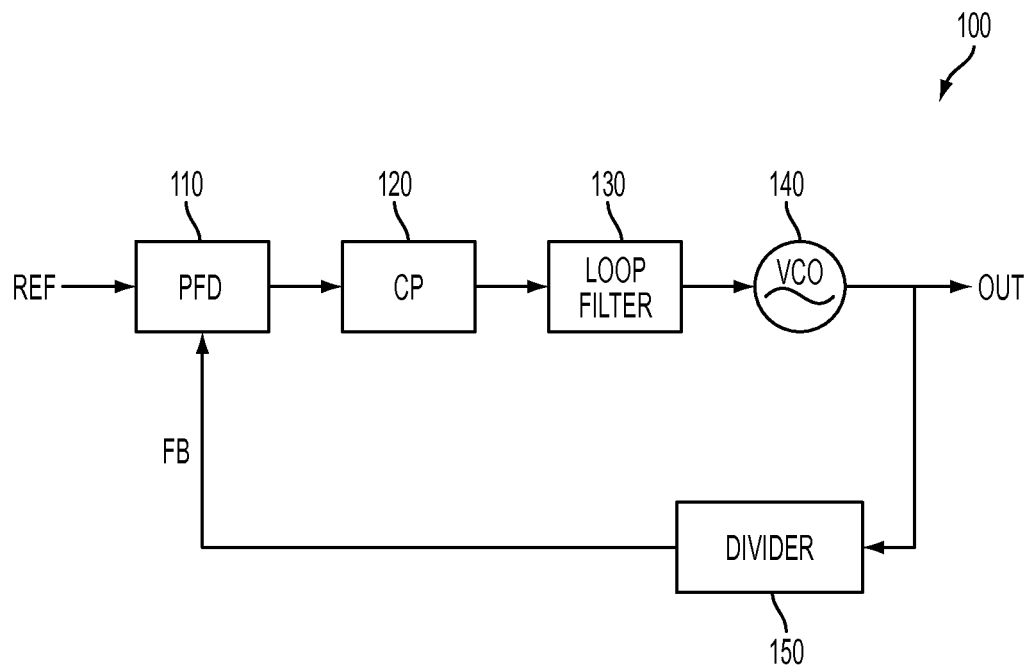
FIG. 1 is a diagram of a phase-locked loop (PLL), in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The phase-frequency detector (PFD) circuit in various embodiments does not increase the width of the turn-on pulse used to turn on the charge pump of the phase-locked loop (PLL). As a result, the blind condition of the PFD is eliminated. The PFD in various embodiments speeds up the locking process and is therefore suitable for use in high frequency PLL applications. In some embodiments, the PFD operates up to the Giga-hertz (GHz) range, which is faster than other approaches.

The Phase-Locked Loop

FIG. 1 is a diagram of a phase-locked loop (PLL) 100, in accordance with some embodiments.

A phase-frequency detector (PFD) circuit 110 receives a reference signal REF and a feedback signal FB that have a time or a phase difference. PFD 110 detects the phase difference and provides output signals related to the phase difference between signal REF and signal FB for use by a charge pump circuit 120.

Charge pump circuit (CP) 120, based on the output signals of PFD 110, provides a current output. In some embodiments, when the frequencies of signal REF and signal FB are not the same, CP 120 adjusts the current output to adjust the frequency of a voltage-controlled oscillator (VCO) 140 such that, eventually, the frequencies of signals REF and FB are about the same. In some embodiments, CP 120 includes a metal-oxide semiconductor (MOS) transistor (not shown) that is turned on or off by a turn-on pulse. Further, the turn-on pulse is designed to have a pulse width sufficient to turn on charge pump 120, but not so large as to decrease the operational frequency of PLL 100.

A loop filter 130 converts the output current of charge pump 120 to an output voltage that controls the frequency of the VCO 140.

VCO 140 is controlled in oscillation frequency by the output voltage of loop filter 130, and provides a signal OUT, which, in some embodiments, is a sinusoidal wave.

A divider circuit 150 divides the frequency of signal OUT by a dividing factor, for example, factor N, where N is an integer. As a result, the frequency of signal FB is divided by N from the frequency of signal OUT. In some embodiments, at a stable condition, signal REF and signal FB have about the same frequency.

The Phase-Detector Circuit

Figure 2:
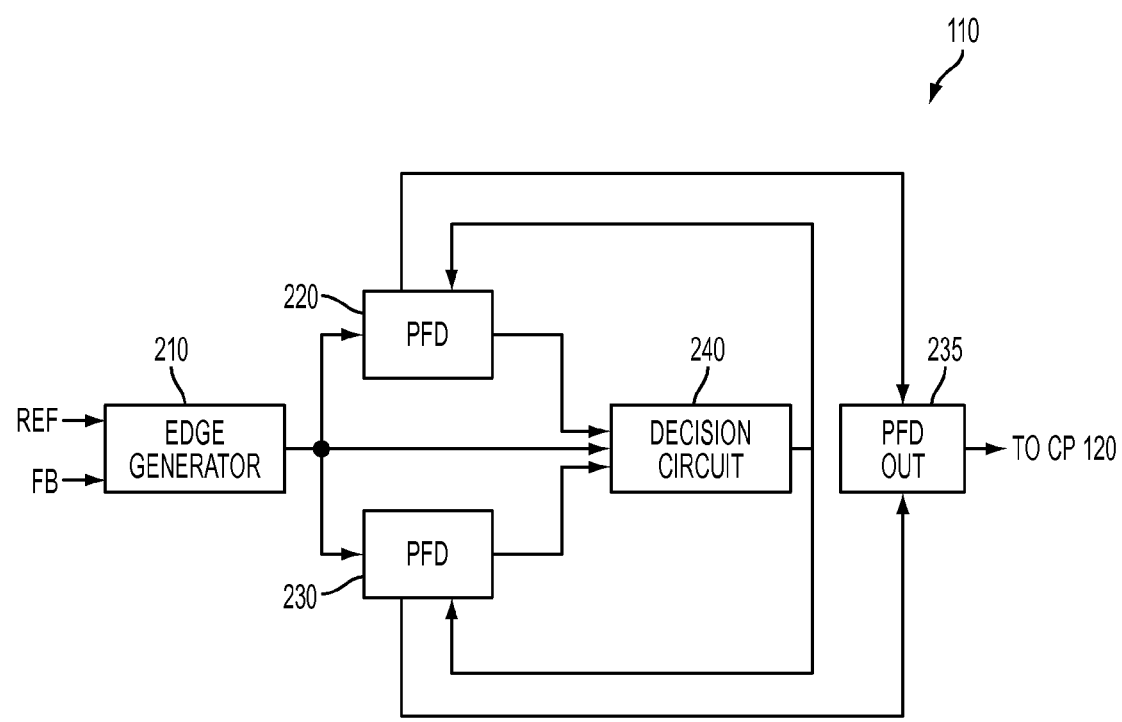
FIG. 2 is a diagram of the phase frequency detector (PFD) circuit of the PLL in FIG. 1, in accordance with some embodiments.

FIG. 2 is a diagram of PFD 110, in accordance with some embodiments. Other implementations of PFD 110 are within the scope of various embodiments.

An edge generator circuit 210 receives signals REF and FB, and generates signals relative to signals REF and FB for use by circuits 220, 230, and 240. For example, as illustratively shown in FIG. 3A, edge generator circuit 210, in some embodiments, generates signals REFQ and FBQ each of which is a divide-by-two of signals REF and FB, respectively. Circuit 210 also generates signals REFQB and FBQB, which are the inverse logic of signals REFQ and FB, respectively.

Phase frequency detector sub-circuits (PFDs) 220 and 230 receive the outputs of circuits 210 and 240 and provide signals for use in detecting the phase difference between signals REF and FB. For example, PFDs 220 and 230 provide the output signals to PFD OUT circuit 235 based on which circuit PFD OUT 235 provides signals UP_OUT and DN_OUT illustratively shown in FIG. 4C for use by charge pump 120.

In some embodiments, PFDs 220 and 230 also generate signals corresponding to the rising edges of signals REF and FB based on which decision circuit 240 determines whether a blind condition exists. Examples of blind conditions are illustrated with reference to FIGS. 5A and 5B below. In some embodiments, if a blind condition is detected, a decision circuit 240 enables PFD 220 to detect the phase difference between signal REF and signal FB. Decision circuit 240, at the same time, disables PFD 230. In contrast, if a blind condition is not detected, decision circuit 240 enables PFD 230 to detect the phase difference between signal REF and signal FB. At the same time, decision circuit 240 disables PFD 220. Effectively, when PFD 220 is turned on, PFD 230 is turned off, and vice versa.

The Edge Generator Circuit

Figure 3A:
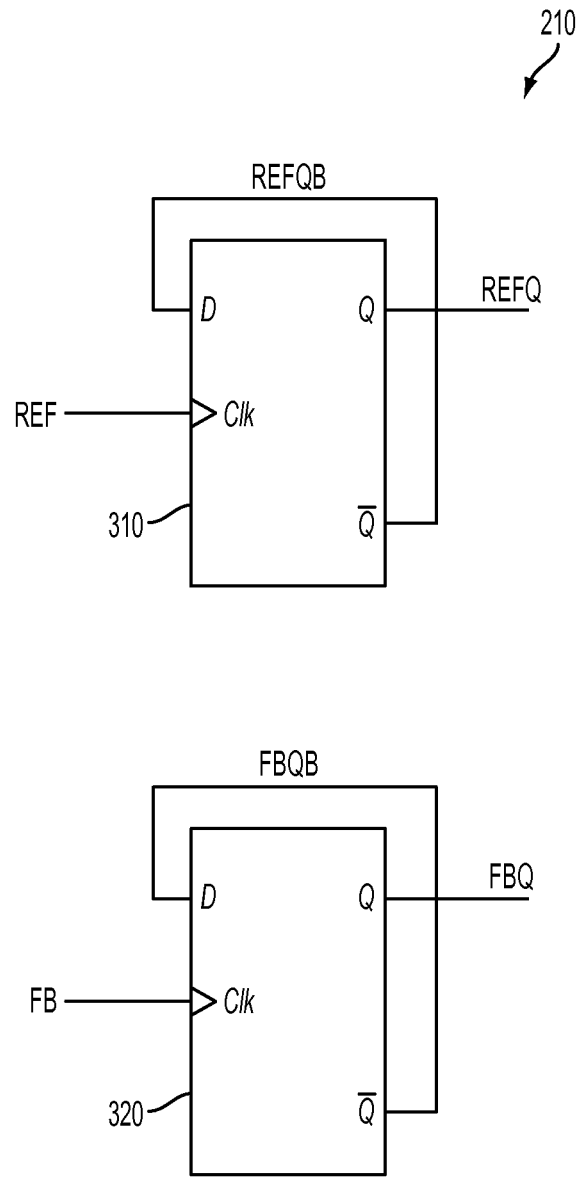
FIG. 3A is a diagram of an edge generator circuit of the PFD circuit in FIG. 2, in accordance with some embodiments.

FIG. 3A is a diagram of edge generator 210, in accordance with some embodiments. Other implementations of edge generator 210 are within the scope of various embodiments.

A D flip-flop 310 receives signal REF as a clock input and signal REFQB as the data input, and provides signals REFQ and REFQB as outputs. Signal REFQB is the inverse logic of signal REFQ. Stated differently, signal REFQ and signal REFQB are 180° out of phase with each other. Based on the configuration of flip-flop 310 that receives signal REFQB as the data input and signal REF as the clock input, the frequency of output signal REFQ is half the frequency of signal REF. In other words, signal REFQ is a divide-by-two of signal REF.

A D flip-flop 320 receives signal FB as a clock input and signal FBQB as the data input, and provides signal FBQ and signal FBQB as outputs. Signal FBQB is the inverse logic of signal FBQ. Stated differently, signal FBQ and signal FBQB are 180° out of phase with each other. Based on the configuration of flip-flop 320 that receives signal FB as the clock input and signal FBQB as the data input, the frequency of signal FBQ is half the frequency of signal FB. In other words, signal FBQ is a divide-by-two of signal FB.

Figure 3B:
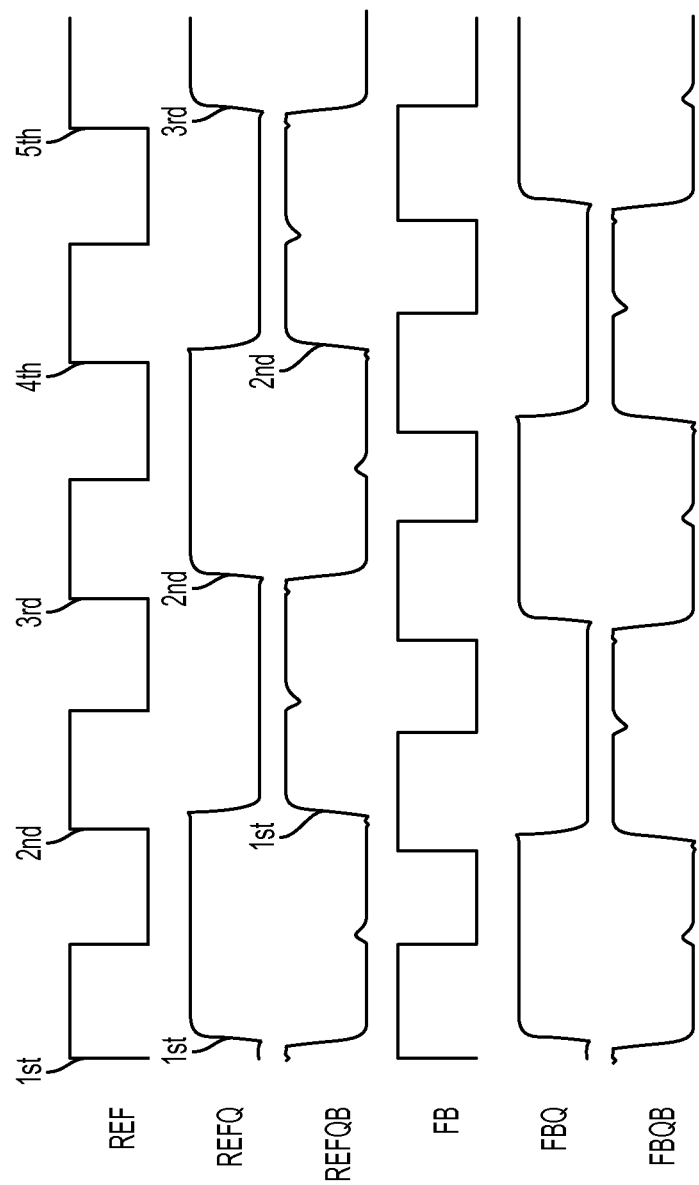
FIG. 3B is a graph of waveforms illustrating the relationship of various signals, in accordance with some embodiments.

FIG. 3B is a graph of waveforms illustrating the relationship of various signals, in accordance with some embodiments. Based on the configuration of flip-flop 310, the frequency of signal REFQ is half the frequency of signal REF, and is illustratively shown in FIG. 3B. Explained differently, the period of signal REFQ is twice the period of signal REF. Further, signal REFQB is shown having an inverse logic of signal REFQ. Signal REFQB has the same frequency and period as those of signal REFQ.

Also shown in FIG. 3B, the first rising edge of signal REFQ corresponds to the first rising edge of signal REF. The second rising edge of signal REFQ corresponds to the third rising edges of signal REF, and the third rising edge of signal REFQ corresponds to the fifth rising edge of signal REF, etc. For illustration, I and J are integers, I corresponds to the $I^{th}$ rising edge of signal REF, and J corresponds to the $J^{th}$ rising edge of signal REFQ. Mathematically expressed, I=2J−1.

Further, the first rising edge of signal REFQB corresponds to the second rising edge of signal REF. The second rising edge of signal REFQB corresponds to the fourth rising edge of signal REF, and the third rising edge of signal REFQB (not shown) corresponds to the sixth rising edge of signal REF (not shown), etc. For illustration, K is integer and corresponds to the $K^{th}$ rising edge of signal REFQB. Mathematically expressed, I=2K.

In some embodiments, signal REFQ is used to detect the odd rising edges of signal REF that include the first, the third, the fifth rising edges, etc. In contrast, signal REFQB is used to detect the even rising edges of signal REF that include the second, the fourth, the sixth rising edges, etc.

For simplicity, the rising edges of signals FB, FBQ, and FBQB are not labeled. The relationships between signals FB, FBQ, and FBQB, however, are similar to the relationships between signals REF, REFQ, and REFQB, respectively. For example, the period of signal FBQ is twice the period of signal FB. Signal FBQB is a logical inverse of signal FBQ. Signal FBQB has the same frequency and period as those of signal FBQ, etc.

Further, the first rising edge of signal FBQ corresponds to the first rising edge of signal FB. The second rising edge of signal FBQ corresponds to the third rising edges of signal FB, and the third rising edge of signal FBQ corresponds to the fifth rising edge of signal FB, etc. For illustration, L and M are integers, L corresponds to the $L^{th}$ rising edge of signal FB, and M corresponds to the $M^{th}$ rising edge of signal FBQ. Mathematically expressed, L=2M−1.

Additionally, the first rising edge of signal FBQB corresponds to the second rising edge of signal FB. The second rising edge of signal FBQB corresponds to the fourth rising edge of signal FB, and the third rising edge of signal FBQB (not shown) corresponds to the sixth rising edge of signal FBQ (not shown), etc. For illustration, N is an integer and corresponds to the $N^{th}$ rising edge of signal FBQ. Mathematically expressed, L=2N.

In some embodiments, signal FBQ is used to detect the odd rising edges of signal FB that include the first, the third, the fifth rising edges, etc. In contrast, signal FBQB is used to detect the even rising edges of signal FB that include the second, the fourth, the sixth, rising edges, etc.

In some embodiments, based on the timing relationship between signal REFQ and signal FBQ, the timing relationship between signal REF and FB is determined. For example, if a rising edge of signal REFQ leads a corresponding rising edge of signal FBQ, then signal REF leads signal FB. In contrast, if a rising edge of signal REFQ lags a corresponding rising edge of signal FBQ, then signal REF lags signal FB, etc.

In FIG. 3A, PFD 210 is used to detect each rising edge of signals REF and FB by separately detecting odd rising edges based on signal REFQ and even rising edges based on signal REFQB. Other circuits detecting each rising edge of signals REF and FB by different methods are within the scope of various embodiments. For example, a circuit in some other embodiments may detect consecutive rising edges, such as, the first rising edge, the second rising edge, the third rising edge, the fourth rising edge, etc.

In FIG. 3A, signal REFQ is a divide-by-two of signal REF. As a result, in some embodiments, signal REFQ is used to correspond to the odd rising edges including the $1^{st}$, $3^{rd}$, $5^{th}$ rising edges, etc., and signal REFQB is used to correspond to the even rising edges including the $2^{nd}$, $4^{th}$, $6^{th}$ rising edges, etc., of signal REF. Other divisions of signal REFQ and associated signals to correspond to every rising edge of signal REF are within the scope of various embodiments. Such divisions include, for example, a divide-by-three, a divide-by-four, . . . , a divide-by-O where O is an integer.

In a divide-by-three situation, signal REFQ is used to correspond to the $1^{st}$, $4^{th}$ and $7^{th}$ rising edges, etc. A second signal, such as signal REFQ2 (not labeled), is used to correspond to the $2^{nd}$, $5^{th}$, and $8^{th}$ rising edges, etc., and a third signal, such as signal REFQ3 (not labeled), is used to correspond to the $3^{rd}$, $6^{th}$, and $9^{th}$ rising edges, etc. For illustration, P, Q, R, and S are integers. If P corresponds to the $P^{th}$ rising edge of signal REF, Q corresponds to the $Q^{th}$ rising edge of signal REFQ, then P=3Q-2. If R corresponds to the $R^{th}$ rising edge of signal REFQ2, then P=3R-1. If S corresponds to the $S^{th}$ rising edge of signal REFQ3, then P=3S.

In a divide-by-four situation, signal REFQ is used to correspond to the $1^{st}$, $5^{th}$, and $9^{th}$ rising edges, etc. A second signal such as signal REFQ42 (not labeled) is used to correspond to the $2^{nd}$, $6^{th}$, and $10^{th}$ rising edges, etc. A third signal such as signal REFQ43 (not labeled) is used to correspond to the $3^{rd}$, $7^{th}$, $11^{th}$ rising edges, etc. A fourth signal such as signal REFQ44 (not labeled) is used to correspond to the $4^{th}$, $8^{th}$, and $12^{th}$ rising edges, etc. For illustration, T, U, V, X and Y are integers. If T corresponds to the $T^{th}$ rising edge of signal REF, U corresponds to the $U^{th}$ rising edge of signal REFQ42, then T=4U-3. If V corresponds to the $V^{th}$ rising edge of signal REFQ43, then T=4V-2. If X corresponds the $X^{th}$ rising edge of signal REFQ43, then T=4X-1. If Y corresponds to the $Y^{th}$ rising edge of signal REFQ44, then T=4Y. Signals for a divide-by-O and their relationship should be recognizable by persons of ordinary skill in the art in view of this disclosure.

The Phase-Frequency Detector Sub-Circuits

Figure 4A:
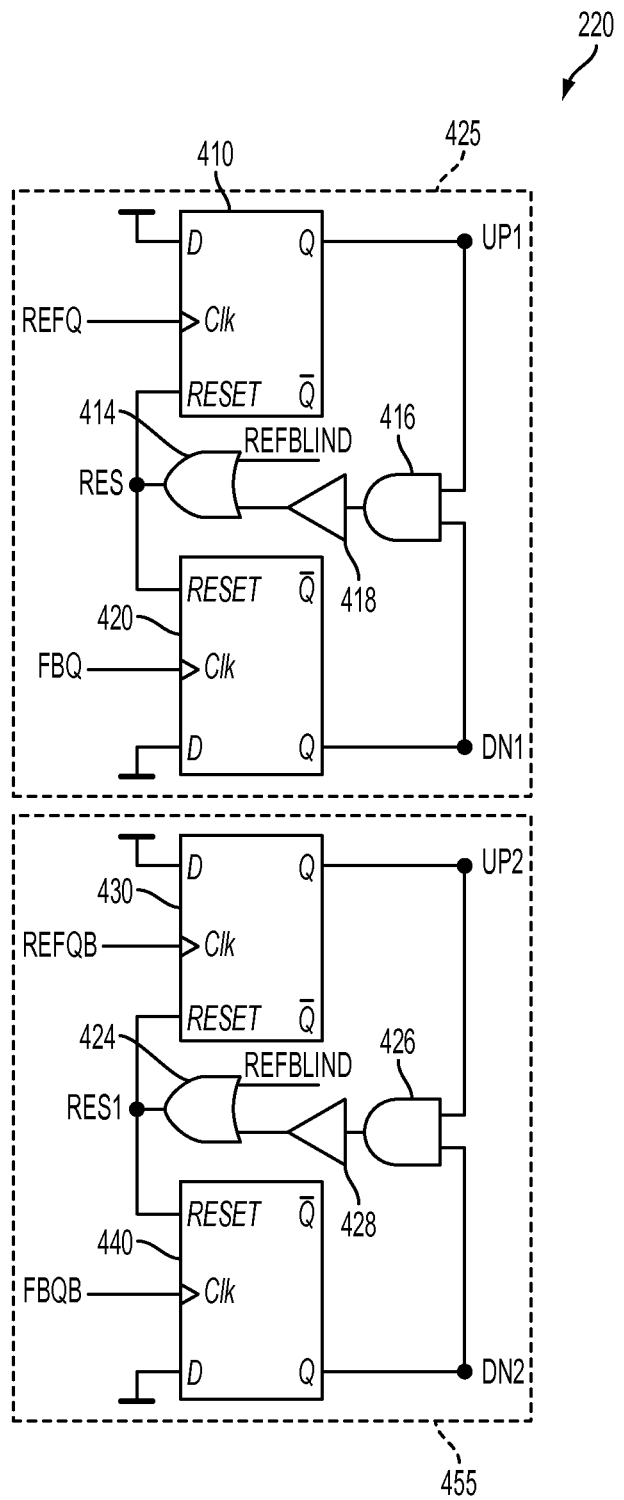
FIG. 4A is a diagram of a PFD sub-circuit of the PFD circuit in FIG. 2, in accordance with some embodiments.

FIG. 4A is a diagram of phase-frequency detector (PFD) sub-circuit 220, in accordance with some embodiments. Other implementations of PFD 220 are within the scope of various embodiments.

PFD 220 includes circuits 425 and 455. The data input D of flip flop 410 is configured to receive a logical high value. D flip-flop 410 receives signal REFQ as a clock signal, and provides signal UP1 as an output. As a result, at a rising edge of clock signal REFQ, signal UP1 is logically high. In other words, a rising edge of clock signal REFQ creates a rising edge of signal UP1. Signal UP1 transitions from a logical high value to a logical low value when flip-flop 410 is reset, for example, when signal RES at the reset terminal of flip-flop 410 is logically high. Effectively, a rising edge of signal RES causes the falling edge of signal UP1.

In some embodiments, flip-flop 410 is reset before every rising edge of clock signal REFQ so that signal UP1 falls before every rising edge of clock signal REFQ. When the positive pulse width of signal UP1, however, is too long such that the falling edge of signal UP1 extends close to or beyond the rising edge of signal REFQ in the next cycle, a blind condition occurs. As a result, the rising edge of signal UP1 in the next cycle cannot be generated.

In some embodiments, the minimum pulse width of signal UP1 used to turn on charge pump 120 is called the turn-on pulse, and is generated by delay circuit 416. Further, the positive pulse width of signal UP1 is proportional to the time charge pump 120 is charged.

An input D of a flip flop 420 is configured to receive a logical high value. D flip-flop 420 receives signal FBQ as a clock, and provides signal DN1 as an output. As a result, at a rising edge of clock signal FBQ, signal DN1 is logically high. In other words, a rising edge of signal FB causes a rising edge of signal DN1. Signal DN1 transitions from a high logical value to a low logical value when flip-flop 420 is reset, for example, when signal RES at the reset terminal of flip-flop 420 is logically high. Effectively, a rising edge of signal RES causes the falling edge of signal DN1.

In some embodiments, flip-flop 420 is reset before every rising edge of clock signal FBQ so that signal DN1 falls before every rising edge of clock signal FBQ. When the positive pulse width of signal DN1, however, is too long such that the falling edge of signal DN1 extends close to or beyond the rising edge of signal FBQ in the next cycle, a blind condition occurs. As a result, the rising edge of signal DN1 in the next cycle cannot be generated.

In some embodiments, the rising edges of signal UP1 and DN1 are used to determine the time or phase relationship between signal REF and signal FB. For example, if a rising edge of signal UP1 leads a corresponding rising edge of signal DN1, then signal REF leads signal FB. In contrast, if a rising edge of signal UP1 lags a corresponding rising edge of signal DN1, signal REF lags signal FB, etc.

An AND gate 416 receives signals UP1 and DN1 as inputs. The output of AND gate 416 is logically high when both signals UP1 and DN1 are logically high. In some embodiments, when after both signals UP1 and DN1 are logically high, both signals UP1 and DN1 are reset to be logically low so that the rising edge of each signal UP1 and DN1 can be generated in the next cycle. For example, when both signals UP1 and DN1 are logically high, the output of AND gate 416 is logically high. After some delay by a delay circuit 418, signal RES is logically high, when signal REFBLIND is logically low. As a result, flip-flops 410 and 420 are reset. In other words, the outputs of flip-flops 410 and 420 or signals UP1 and DN1 turn to a logical low value.

Delay circuit 418 provides a time delay for the output of AND gate 416, and generates an output serving as an input of an OR gate 414. Effectively, delay circuit 418 delays a rising edge for signal RES, and thus delays to reset flip-flops 410 and 420.

In some embodiments, a "turn-on" pulse is generated to turn on a MOS transistor in charge pump CP 120. For example, when NMOS transistors are used as switches in CP 120, the high duration of the turn-on pulse is applied to the gates of the NMOS transistors to turn on the NMOS transistors. In contrast, when PMOS transistors are used as switches in CP 120, the inverse logic of the turn-on pulse is applied to the gates of the PMOS transistors to turn on the PMOS transistors. In some embodiments, delay circuit 418 is controlled such that the turn-on pulse width is sufficiently large to turn on the MOS transistors. The turn-on pulse, however, is controlled to a limit such that a large pulse that degrades the frequency of PFD 220 is avoided.

In some embodiments, signal REFBLIND is provided by decision circuit 240, and is used to indicate whether a blind condition exists in PFD 110. For example, when a blind condition exists, signal REFBLIND is logically high. But if the blind condition does not exist, signal REFBLIND is logically low. In effect, signal RES is logically high and both flip-flops 410 and 420 are reset when a blind condition exists.

OR gate 414 provides the reset signal RES to reset flip-flops 410 and 420. OR gate 414 receives signal REFBLIND and the output of delay circuit 418 as inputs. As a result, signal RES is logically high when either signal REFBLIND or the output of delay circuit 418 is logically high. When signal REFBLIND is logically high, a blind condition exists. Signal RES through OR gate 414 is logically high to reset flip-flops 410 and 420, or, in other words, to turn off PFD 220. But when signal REFBLIND is logically low, the blind condition does not exist. In such a situation, PFD 220 is said to be turned on. Signal RES is generated to reset flip-flops 410 and 420 after both signal UP1 and signal DN1 are logically high.

Signal RES is fed to the reset terminals of both flip-flops 410 and 420. As a result, in some embodiments, when reset signal RES is logically high, both flip-flops 410 and 420 are reset. Effectively, both signals UP1 and DN1 at the outputs of flip-flops 410 and 420 are turned to a logical low value. In other words, the rising edge of signal RES creates the falling edge of each of signals UP1 and DN1.

In some embodiments, when the positive pulse width of signal RES is too large such that the falling edge of signal RES is close to or overlaps the rising edge of signal REFQ in the next cycle, flip-flop 410 cannot generate a rising edge for signal UP1. As a result, a blind condition with respect to signal REF occurs. Similarly, when the falling edge of signal RES is close to or overlaps the rising edge of signal FBQ, flip-flop 420 cannot generate a rising edge for signal DN1, a blind condition with respect to signal FB occurs.

A circuit 455 includes circuit components similar to those of circuit 425. As a result, circuit 455 functions in a manner similar to circuit 425. A flip-flop 430, a flip-flop 440, an OR gate 424, a delay circuit 428, and an AND gate 426 correspond to flip-flop 410, flip-flop 420, OR gate 414, delay circuit 418, and AND gate 416, respectively. Similarly, signals REFQB, FBQB, RES1, UP2, and DN2 correspond to signals REFQ, FBQ, RES, UP1, and DN1, respectively.

Effectively, when a blind condition exists, flip-flops 430 and 440 and thus signals UP2 and DN2 are reset. In other words, PFD 220 is turned off. In contrast, when a blind condition does not exist, flip-flops 430 and 440, and thus signals UP2 and DN2 are reset after some time delay from when both signals REFQB and FBQB are logically high. The time delay is provided by delay circuit 428.

In some embodiments, when a blind condition does not exist with respect to signals UP1, DN1, UP2, and DN2, PFD 220 is activated and used to detect the phase difference between signals REF and FB for PLL 100. For example, when a blind condition does not exist, signal REFBLIND is logically low, signal RES is electrically the same as the output of delay circuit 418. In effect, the reset status of flip flops 410 and 420 that receive signal RES is based on signals UP1 and DN1.

Figure 4B:
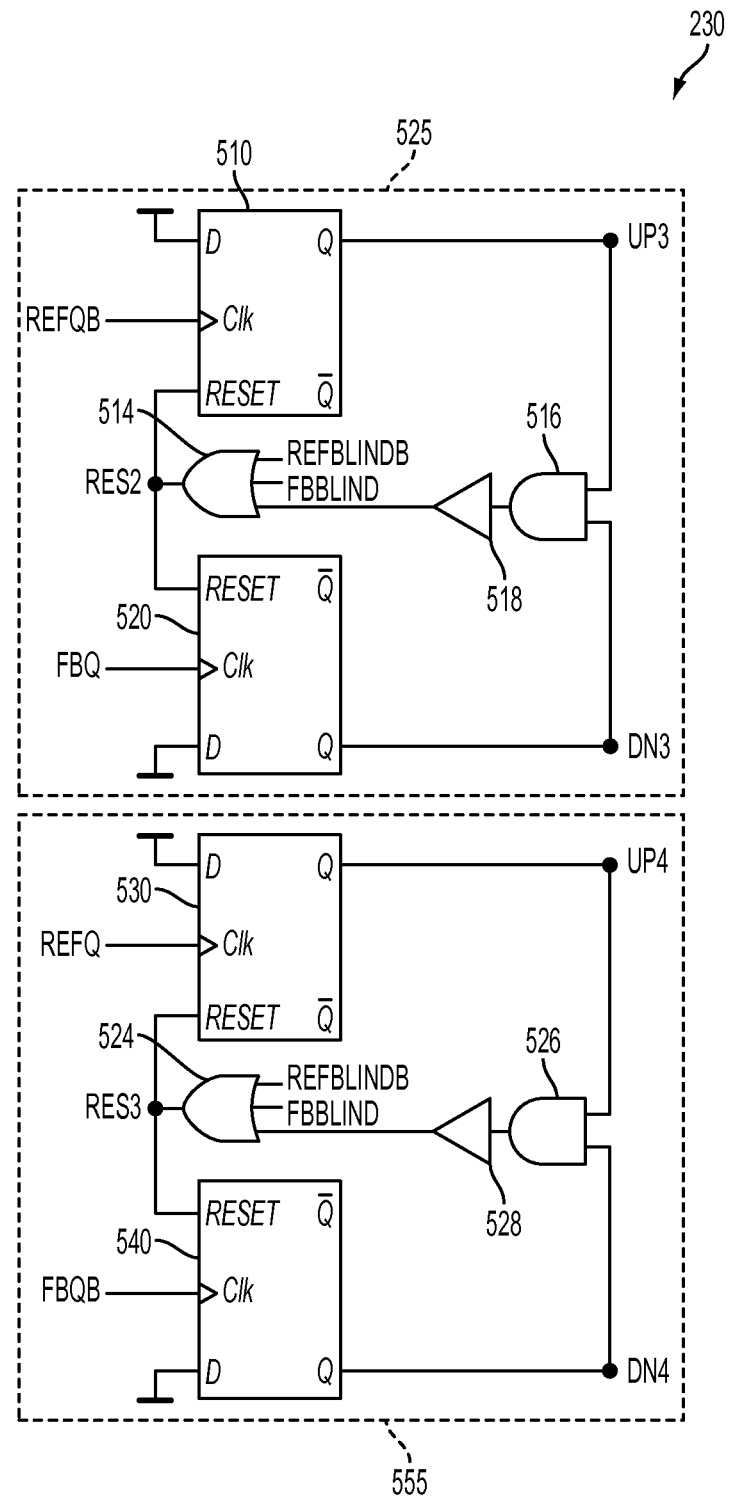
FIG. 4B is a diagram of another PFD sub-circuit of the PFD circuit in FIG. 2, in accordance with some embodiments.

FIG. 4B is a diagram of a phase frequency detector sub-circuit (PFD) 230, in accordance with some embodiments. Other implementations of PFD 230 are within the scope of various embodiments.

PFD 230 has similar circuitry components as those of PFD 220. As a result, PFD 230 functions in a manner similar to PFD 220. In FIG. 4B, a circuit 525 corresponds to circuit 425 in FIG. 4A. A flip-flop 510, a flip-flop 520, an OR gate 514, a delay circuit 518, and an AND gate 516 correspond to flip-flop 410, flip-flop 420, OR gate 414, delay circuit 418, and AND gate 416, respectively. Similarly, signals REFQB, FBQ, RES2, UP3, and DN3 correspond to signals REFQ, FBQ, RES, UP1, and DN1 in FIG. 4A, respectively.

OR gate 514 receives signal REFBLINDB instead of signal REFBLIND as OR gate 414, wherein signal REFBLINDB is an inverse logic of signal REFBLIND. Effectively, when signal REFBLIND is logically high, signal REFBLINDB is logically low and vice versa. As a result, signal RES2 depends on the logic of signal FBBLIND or the output of delay circuit 518. In contrast, when signal REFBLIND is logically low, signal REFBLINDB is logically high. Signal RES2 is thus logically high. As a result, flip-flops 510 and 520 are reset. In other words, PFD 230 is turned off. OR gate 514 also receives signal FBBLIND as an input. In some embodiments, when signal FBBLIND is logically high, a blind condition exists with respect to signal FB. Further, when signal FBBLIND is logically high, signal FBBLIND is used to reset signal REFBLIND. Effectively, when a blind condition exists with respect to PFD 230, PFD 230 is turned off, but PFD 220 is turned on.

Functionally, in FIG. 4B, flip-flops 510 and 520 are reset, and signals UP3 and DN3 turn to a logical low value when a blind condition represented by signal FBBLIND exists or when both signals UP3 and DN3 are logically high or signal REFBLINDB is logically high.

A circuit 555 corresponds to circuits 455 in FIG. 4A. A flip-flop 530, a flip-flop 540, an OR gate 524, a delay circuit 528, and an AND gate 526 correspond to flip-flop 430, flip-flop 440, OR gate 424, delay circuit 428, and AND gate 426 in FIG. 4A, respectively. Similarly, signals REFQ, FBQB, RES3, UP4, and DN4 correspond to signals REFQB, FBQB, RES1, UP2, and DN2 in FIG. 4A, respectively.

OR gate 524 receives signal REFBLINDB instead of signal REFBLIND as OR gate 424 wherein signal REFBLINDB is an inverse logic of signal REFBLIND. As a result, when signal REFBLIND is logically high, signal REFBLINDB is logically low. Signal RES3 thus depends on the logic of signal FBBLIND or the output of delay circuit 528. In contrast, when signal REFBLIND is logically low, signal REFBLINDB is logically high, and signal RES3 is logically high. As a result, flip-flops 530 and 540 are reset. In other words, PFD 230 is turned off. OR gate 524 also receives signal FBBLIND as an input. In some embodiments, when signal FBBLIND is logically high, a blind condition exists with respect to signal FB. Further, when signal FBBLIND is logically high, signal FBBLIND is used to reset signal REFBLIND. Effectively, when a blind condition exists with respect to PFD 230, PFD 230 is turned off, but PFD 220 is turned on.

Functionally, in FIG. 4B, flip-flops 530 and 540 are reset, and signals UP4 and DN4 turn to a logical low value when a blind condition represented by signal FBBLIND exists or when both signals UP4 and DN4 are logically high or signal REFBLINDB is logically high.

In some embodiments, when PFD 220 is enabled, PFD 230 is disabled or turned off and vice versa. For example, if signal REFBLIND is logically high, reset signals RES and RES1 are logically high through respective OR gates 414 and 424 in FIG. 4A. As a result, flip-flops 410, 420, 430, and 440 are reset. Effectively, PFD 220 is disabled. At that time, signal REFBLINDB is logically low, and has no logical effect on signal RES2 or signal RES3 in PFD 230 through respective OR gates 514 and 524. Further, signal FBBLIND in PFD 230 is also logically low because when signal REFBLIND is logically high and if signal FBBLIND is also logically high, flip-flop 680 in FIG. 6 resets signal FBBLIND to a logical low value. Effectively, PFD 230 is enabled.

In contrast, if signal REFBLIND is logically low, reset signals RES and RES1 have the logical value of the output of circuits 418 and 428, respectively. As a result, PFD 220 in FIG. 4A is enabled. At that time, signal REFBLINDB in FIG. 4B is logically high. As a result, signals RES2 and RES3 are logically high, which reset flip-flops 510, 520, 530, and 540. Effectively, PFD 230 is disabled.

In circuit 425, because signals REFQ and FBQ are used as the clock inputs for flip-flops 410 and 420, signals UP1 and DN1 provide the time relationship between signal REF and signal FB based on an odd rising edge of each of signals REF and FB, respectively. In circuit 455, because signals REFQB and FBQB are used as the clocks inputs for flip-flops 430 and 440, signals UP2 and DN2 provide the time relationship between signal REF and signal FB based on an even rising edge of each of signals REF and FB, respectively. In circuit 525, because signals REFQB and FBQ are used as the clock inputs for flip-flops 510 and 520, signals UP3 and DN3 provide the time relationship between signal REF and signal FB based on an even rising edge of signal REF and an odd rising edge of signal FB. In circuit 555, because signals REFQ and FBQB are used as the clocks inputs for flip-flops 530 and 540, signals UP4 and DN4 provide the time relationship between signal REF and signal FB based on an odd rising edge of signal REF and an even rising edge of signal FB.

Figure 4C:
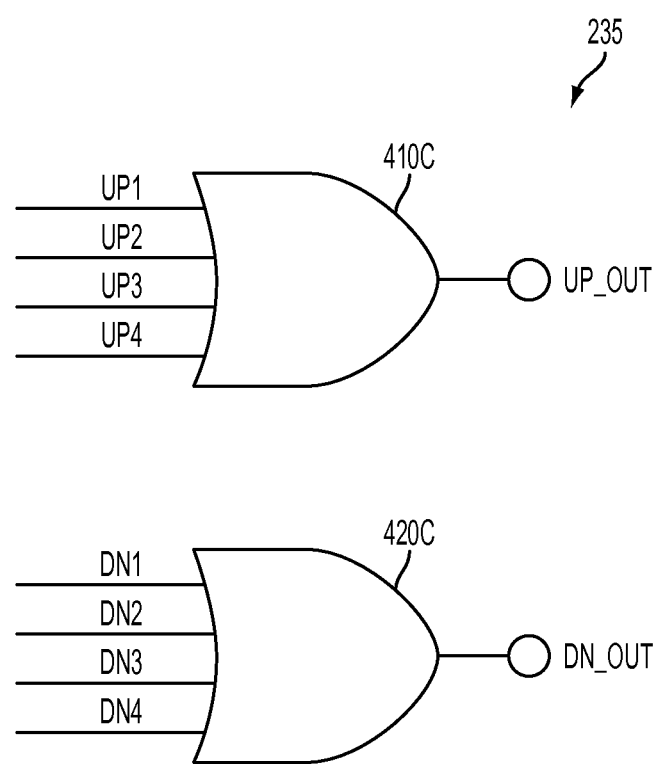
FIG. 4C is a diagram of an output circuit of the PFD sub-circuits in FIGS. 4A and 4B, in accordance with some embodiments.

FIG. 4C is a diagram of PFD OUT circuit 235 in FIG. 2, in accordance with some embodiments. Circuit 235 represents an output stage of PFD 220 and PFD 230. Other implementations of circuit 235 are within the scope of various embodiments.

An OR gate 410C receives signals UP1, UP2, UP3, and UP4, and provides signal UP_OUT. In some embodiments, signal UP_OUT represents a pulse of either signal UP1, UP2, UP3, or UP4.

An OR gate 420C receives signals DN1, DN2, DN3, and DN4, and provides signal DN_OUT. In some embodiments, signal DN_OUT represents a pulse of either signal DN1, DN2, DN3, or DN4.

In some embodiments, when signal UP_OUT reflects any one of signals UP1, UP2, UP3, or UP4, signal DN_OUT reflects the corresponding signal DN1, DN2, DN3, or DN4. In other words, the pair of signals UP_OUT and DN_OUT reflects the pair of signals UP1 and DN1, UP2 and DN2, UP3 and DN3, or UP4 and DN4.

In some embodiments, the pair of signals UP_OUT and DN_OUT is free of a blind condition. For example, when signal REFBLIND is logically low, a blind condition with respect to signal REFQ (or signal REF) does not exist. PFD 220 is turned on to provide the pair of signal UP1 and DN1, and UP2 and DN2 to the pair of signals UP_OUT and DN_OUT. In contrast, when a blind condition with respect to signals UP1 and DN1 exists, PFD 220 is turned off, and each of signals UP1 and DN1 is reset to a low logical value. At the same time, PFD 230 is turned on to provide the corresponding pulses UP3 and DN3 to signals UP_OUT and DN_OUT. Similarly, when a blind condition with respect to signals UP2 and DN2 exists, PFD 220 is turned off, and each of signals UP2 and DN2 is reset to a logical low value. At the same time, PFD 230 is turned on to provide the corresponding signals UP4 and DN4 to signal UP_OUT and DN_OUT. As a result, various embodiments are advantageous over other approaches in which a blind condition with respect to the VCO exists, which prolongs the locking time of the PLL.

In some embodiments, signals UP_OUT and DN_OUT are used to adjust the frequency of VCO 140. For example, in some embodiments, when the frequency of signals REF and FB are not the same, the widths of the positive pulses of signals UP_OUT and DN_OUT are not the same. As a result, charge pump 120 is adjusted to provide a different current value at the output of charge pump 120. As a result, a voltage value at the input of VCO 140 is also adjusted that adjusts the frequency of VCO 140 until the pulse widths of signals UP_OUT and DN_OUT are about the same. At such a condition, the frequencies of signal REF and FB are about the same.

In the above illustration, two phase frequency detector sub-circuits 220 and 230 are used for illustration, a different number of phase frequency detector sub-circuits are within the scope of various embodiments. In some embodiments, the frequency or period relationship between signal REF and signal REFQ and between signal FB and signal FBQ determine the number of phase frequency detector sub-circuits to be used in a phase frequency detector circuit. For example, when each of signals REFQ and FBQ is a divide-by-O of respective signals REF and FB, O number of phase frequency detector sub-circuits are used in a phase frequency detector circuit 110. O is an integer number. As illustratively shown in FIG. 2 in which each of signals REFQ and FBQ is a divide-by-two of respective signals REF and FB, two phase frequency detector sub-circuits 220 and 230 are used. When each of signals REFQ and FBQ is a divide-by-three of respective signals REF and FB, three phase frequency detector sub-circuits are used. When each of signals REFQ and FBQ is a divide-by-four of respective signals REF and FB, four phase frequency detector sub-circuits are used, etc.

The Blind Conditions

In some embodiments, a blind condition exists when a rising edge of any one of signals UP1, DN1, UP2, DN2, UP3, DN3, UP4, DN4 that is supposed to be generated is not generated. Because the edge is expected but is not generated, the time or phase difference between the rising edges of signals REF and FB cannot be determined. In some embodiments, a blind condition exists when the pulse width of any one of signals UP1, DN1, UP2, DN2, UP3, DN3, UP4, DN4, RES, RES1, RES2, and RES3 extends close to or overlaps a rising edge of signal REFQ and/or of signal FBQ in the next cycle.

Figure 5A:
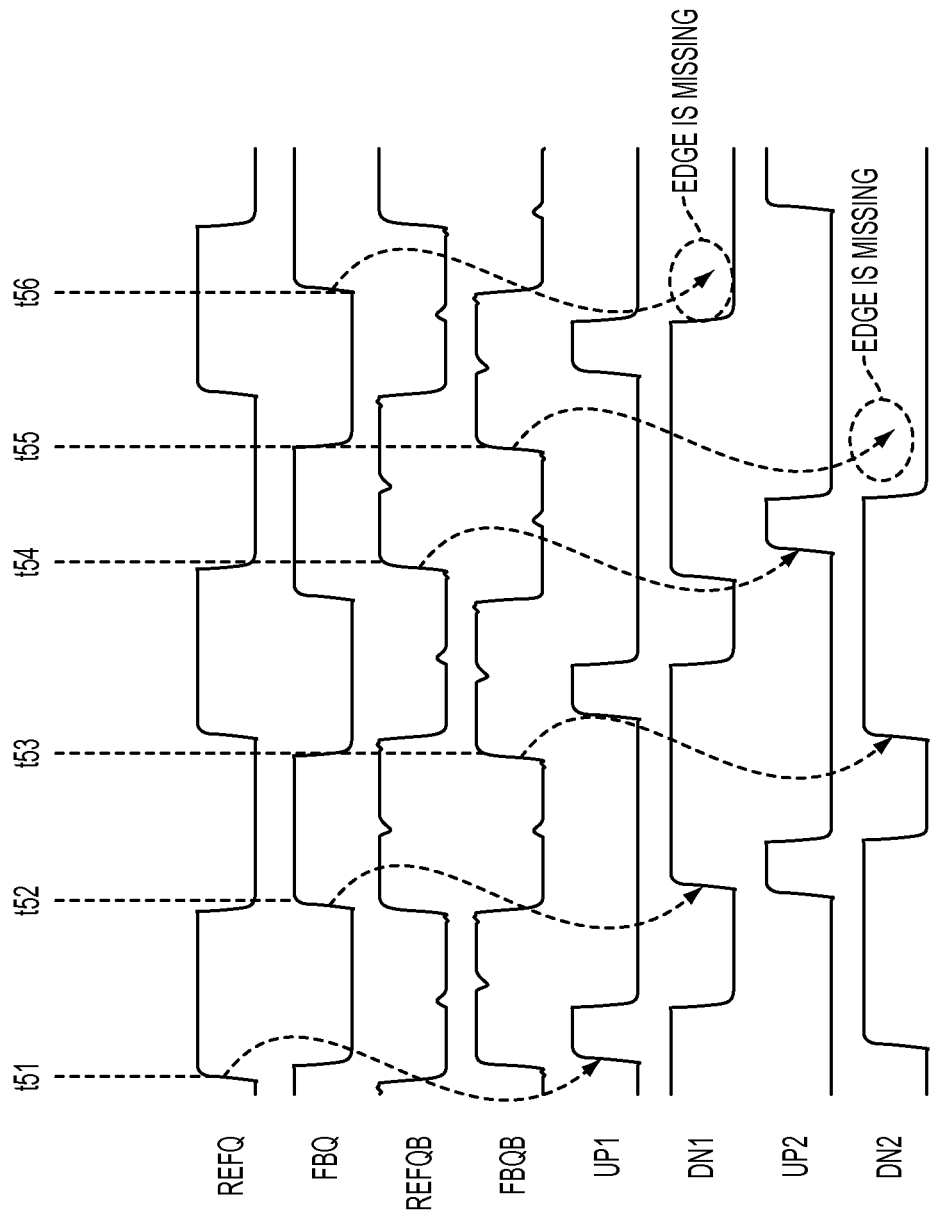
FIGS. 5A and 5B are graphs of waveforms illustrating blind conditions, in accordance with some embodiments.

FIG. 5A is a graph of waveforms illustrating blind conditions, in accordance with some embodiments.

At time t51, flip flop 410 generates a rising edge of signal UP1 based on a rising edge of signal REFQ. As a result, a blind condition does not exist at time t51. Similarly, at times t52, t53, and t544, corresponding flip-flop 420, flip-flop 440, and flip-flop 430 generate each rising edge of signals DN1, DN2, and UP2, based on the rising edges of signals FBQ, FBQB, and REFQB, respectively. As a result, a blind condition does not exist at times t52, t53, and t54.

At time t55, however, flip-flop 440 does not generate a rising edge for signal DN2. Similarly, at time t56, flip-flop 420 is not able to generate a rising edge for signal DN1. As a result, a blind condition exists at each of times t55 and t56.

Figure 5B:
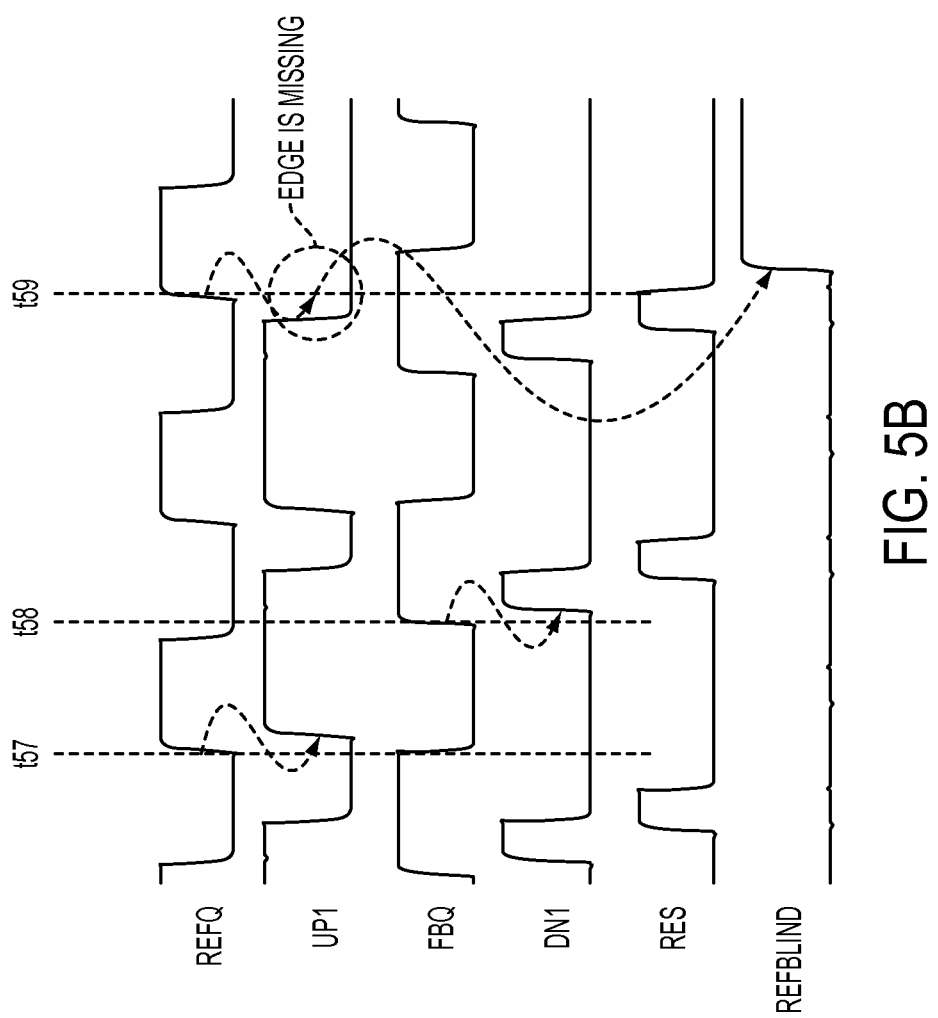

FIG. 5B is a graph of waveforms illustrating another blind condition, in accordance with some embodiments.

At time t57, reset signal RES is not close to or overlapping the rising edge of signal REFQ. A rising edge of signal UP1 is created, and a blind condition does not exist. Similarly, at time t58, reset signal RES is not close to or overlapping the rising edge of signal FBQ. A rising edge of signal DN1 is thus created, and a blind condition does not exist. At time t59, however, reset signal RES overlaps the rising edge of signal REFQ. As a result, a rising edge of signal UP1 is not generated, i.e., is missed, and a blind condition exists.

Soon after the missing edge of signal UP1 is detected, signal REFBLIND is turned to a logical high value, indicating a blind condition exists.

In FIGS. 5A and 5B, three blind conditions with references to signals DN2, DN1, and UP1 are explained for illustration. Other blind conditions with respect to other signals are within the scope of various embodiments, and should be recognizable by persons of ordinary skill in the art in view of this document.

The Decision Circuit

Figure 6:
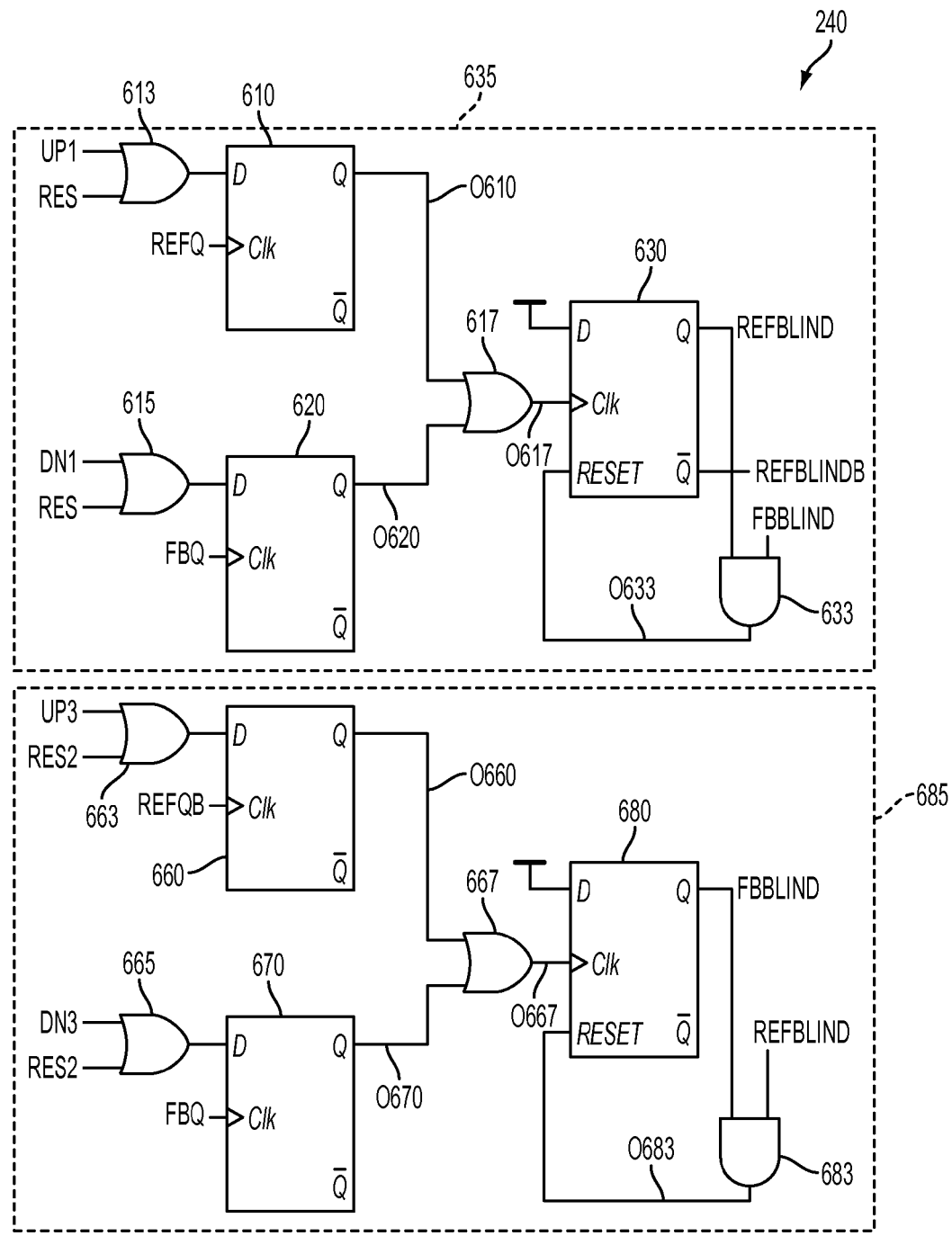
FIG. 6 is a diagram of a decision circuit of the PFD circuit in FIG. 2, in accordance with some embodiments.

FIG. 6 is a diagram of decision circuit 240, in accordance with some embodiments. Other implementations of circuit 240 are within the scope of various embodiments.

Decision circuit 240 determines whether a blind condition exists. In some embodiments, when a blind condition exists with respect to a signal UP1, DN1, UP2, or DN2, decision circuit 240 provides signal REFBLIND having a logical high value to disable PFD 220 in FIG. 4A. At that time, signal REFBLINDB is logically low, and has no logical effect to signal RES2 or signal RES3 in PFD 230 in FIG. 4B. Further, signal FBBLIND in PFD 230 is also logically low because when signal REFBLIND is logically high and if signal FBBLIND is also logically high, flip-flop 680 resets signal FBBLIND to a logical low value. Effectively, PFD 230 is enabled.

In contrast, if a blind condition does not exist with respect to signal UP1 or DN1, decision circuit 240 provides signal REFBLIND having a logical low value. As a result, signals RES and RES1 in FIG. 4A have the logical value of the output of circuits 418 and 428, respectively. Effectively, PFD 220 is turned on. At that time, signal REFBLINDB is logically high. As a result, signals RES2 and RES3 in FIG. 4B are logically high, which reset signals UP3, DN3, UP4, and DN4. Effectively, PFD 230 is turned off.

Decision circuit 240 includes circuits 635 and 685 that function in a similar manner but based on different inputs. In circuit 635, an OR gate 613 receives signals UP1 and RES as inputs. In some embodiments, signal UP1 is reset before the rising edge of signal REF in the next cycle. But if signal UP1 is not reset, i.e., continues to be logically high, a blind condition exists. Similarly, in some embodiments, signal RES is reset before the next rising edge of signal REF. But if signal RES is not reset, i.e., continues to be logically high, a blind condition exists. The output of OR gate 613 is logically high when either signal UP1 or signal RES is logically high. Signal REFQ is used as the clock input for a flip-flop 610. Effectively, OR gate 613 provides the output signal to determine whether signal UP1 or signal RES overlaps with a rising edge of signal REFQ, which also corresponds to a rising edge of signal REF. In other words, the output of OR gate 613 indicates whether a blind condition occurs with respect to signal UP1 or signal RES. For example, a blind condition occurs when PFD 220 can not generate signal UP1 at a rising edge of signal REFQ because, at that time, both signals UP1 and RES are supposed to have been reset, but at least one of them continues to be logically high.

Flip-flop 610 receives the output of OR gate 613 as the data input and signal REFQ as the clock input. As a result, at each rising edge of signal REFQ, output O610 of flip-flop 610 is logically high if the output of OR gate 613 is logically high. Consequently, output O610 is logically high if either signal RES or signal UP1 is logically high at each rising edge of signal REFQ. Because, in some embodiments, signal REFQ is a divide-by-two of signal REF, signal REFQ corresponds to the odd rising edges of signal REF.

An OR gate 615 receives signals DN1 and RES as inputs. In some embodiments, signal DN1 is reset before the rising edge of signal FB in the next cycle. But if signal UP1 is not reset, i.e., continues to be logically high, a blind condition exists. Similarly, in some embodiments, signal RES is reset before the next rising edge of signal FB. But if signal RES is not reset, i.e., continues to be logically high, a blind condition exists. The output of OR gate 615 is logically high when either signal DN1 or signal RES is logically high. Signal FBQ is used as the clock input for a flip-flop 620. Effectively, OR gate 615 provides the output signal to determine whether signal DN1 or signal RES overlaps with a rising edge of signal FBQ, which also corresponds to a rising edge of signal FB. In other words, the output of OR gate 615 indicates whether a blind condition occurs with respect to signal DN1 or signal RES. For example, a blind condition occurs when PFD 220 cannot generate signal DN1 at a rising edge of signal FBQ because, at that time, both signals DN1 and RES are supposed to have been reset, but at least one of them continues to be logically high.

Flip-flop 620 receives the output of OR gate 615 as the data input and signal FBQ as the clock input. As a result, at each rising edge of signal FBQ, output O620 of flip-flop 620 is logically high if the output of OR gate 615 is logically high. Consequently, output O620 is logically high if either signal RES or signal DN1 is logically high at each rising edge of signal FBQ. Because, in some embodiments, signal FBQ is a divide-by-two of signal FB, signal FBQ corresponds to the odd rising edges of signal FB.

An OR gate 617 receives signals O610 and O620 as inputs, and provides output signal O617. As a result, signal O617 is logically high when either signal O610 or signal O620 is logically high. Effectively, signal O617 being logically high indicates a blind condition occurs with respect to either signal UP1, signal DN1, or signal RES.

A D flip-flop 630 receives signal O617 as the clock signal, and a high logical value at the D input. As a result, at the rising edge of signal O617 signal REFBLIND at the output of flip-flop 630 is logically high. In effect, if a blind condition with respect to either one of signals UP1, DN1, and RES occurs, signal REFBLIND is logically high. In some embodiments, when signal REFBLIND is logically high, the outputs of flip flops 410, 420, 430, and 440 in FIG. 4A are reset. Effectively, PFD 220 is reset or turned off. Signals UP1, DN1, UP2, and DN2 are therefore reset or turned to a logical low value.

Signal REFBLINDB is an inverse logic of signal REFBLIND. Signals REFBLIND and REFBLINDB are used to turn on and of PFDs 220 and 230. In some embodiments, when PFD 220 is turned on, PFD 230 is turned off and vice versa. For example, when signal REFBLIND is logically high, signal REFBLINDB is logically low. When signal REFBLIND is logically high, signal RES in FIG. 4A is logically high, which resets or turns off PFD 220. At the same time, signal REFBLINDB is logically low. If signal FBBLIND is logically high, output O633 of AND gate 633 is logically high and causes signal REFBLIND at the output of flip-flop 630 to be logically low. In contrast, if signal FBBLIND is logically low (and signal REFBLINDB is logically low), PFD 230 is turned on.

In contrast, when signal REFBLIND is logically low, PFD 220 is turned on because signal RES follows the output of delay circuit 418 in FIG. 4A. At the same time, signal REFBLINDB is logically high. As a result, signals RES2 and RES3 are logically high, which reset or turn off PFD 230.

An AND gate 633 receives signals REFBLIND and FBBLIND as inputs, and provides signal O633 as an output. As a result, signal O633 is logically high when both signals REFBLIND and FBBLIND are logically high. Signal O633 is fed to the reset terminal of flip-flop 630. In effect, flip-flop 630 is reset and thus signal REFBLIND turns to a logical low value when both signals REFBLIND and FBBLIND are logically high.

A circuit 685 corresponds to circuit 635. A flip-flop 660, a flip-flop 670, a flip-flop 680, an OR gate 663, an OR gate 665, an OR gate 667, and an AND gate 683 correspond to flip-flop 610, flip-flop 620, flip-flop 630, OR gate 613, OR gate 615, OR gate 617, and AND gate 633, respectively. Further, signals UP3, DN3, and RES2 correspond to signals UP1, DN1, and RES in circuit 635, respectively. Additionally, signal FBBLIND at the output of flip-flop 680 corresponds to signal REFBLIND at the output of flip-flop 630, and signal REFBLIND at the input of AND gate 683 corresponds to signal FBBLIND at the input of AND gate 633. Functionally, signal FBBLIND is logically high when a blind condition with respect to any one of signals UP3, DN3, or RES2 occurs.

In FIG. 6, signals UP1, DN1, UP3, and DN3 are used for illustration. Other decision circuits using different signals as inputs are within the scope of various embodiments. For example, an alternative decision circuit, in some other embodiments, receives signals UP2, DN2, UP4, and DN4 in place of signals UP1, DN1, UP3, and DN3, respectively. The alternative decision circuit also receives signals REFQB, FBQB, REFQ, FBQB, RES1, and RES3 in place of signals REFQ, FBQ, REFQB, FBQ, RES, and RES2, respectively. The alternative decision circuit functions in a manner similar to circuit 240.

In FIG. 6, flip-flops 610 and 620 of circuit 240 receive signals REFQ and FBQ as clock signals with corresponding signals UP1, DN1, or RES as the data inputs. Effectively, a blind condition is determined based on an odd rising edge of each signals REF and FB. Further, flip-flops 630 and 640 of circuit 240 receive signals REFQB and FBQ as clock signals with corresponding signals UP3, DN3, or RES2 as the data inputs. Effectively, a blind condition is determined based on an even rising edge of signal REF and an odd rising edge of signal FB.

But if the alternative decision circuit receives signals REFQB, FBQB, UP2, DN2 and RES1 as inputs for circuit components corresponding to those of circuit 240, a blind condition is determined based on an even rising edge of each of signals REF and FB. And if the alternative decision circuit also receives signals REFQ, FBQB, UP4, DN4, and RES4 as inputs for circuit components corresponding to those of circuit 240, a blind condition is determined based on an even rising edge of signal REF and an odd rising edge of signal FB.

Exemplary Method

Figure 7:
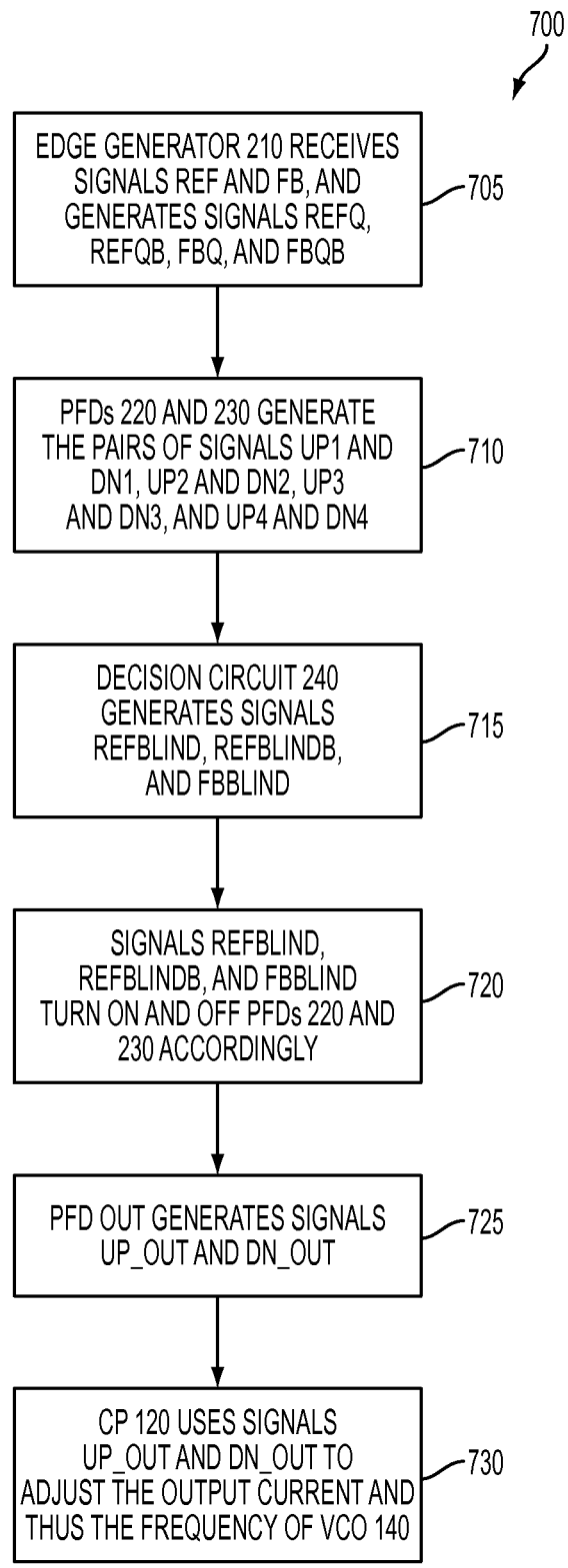
FIG. 7 is a flowchart of a method illustrating an operation of the PFD circuit in FIG. 2, in accordance with some embodiments.

FIG. 7 is a flow chart of a method 700 illustrating operations of PFD 120, in accordance with some embodiments.

In operation 705, edge generator 210 receives signals REF and FB, and generates signals REFQ, REFQB, FBQ, and FBQB.

In operation 710, PFDs 220 and 230 generate the pairs of signals UP1 and DN1, UP2 and DN2, UP3 and DN3, and UP4 and DN4.

In operation 715, decision circuit 240 generates signals REFBLIND, REFBLINDB, and FBBLIND.

In operation 720, if a blind condition exists with respect to any one of signals UP1, DN1, UP2, and DN2, PFD 220 is turned off, and PFD 230 is turned on. But if a blind condition does not exist with respect to any one of signals UP1, DN1, UP2, and DN2, PFD 220 is turned on, and PFD 230 is turned off.

Alternatively, if a blind condition exists with respect to any one of signals UP3, DN3, UP4, and DN4, PFD 230 is turned off, and PFD 220 is turned on. But if a blind condition does not exist with respect to any one of signals UP3, DN3, UP4, and DN4, PFD 230 is turned on, and PFD 220 is turned off.

In operation 725, circuit PFD OUT 235 generates the pair of signals UP_OUT and DN_OUT, which is one of the pair of signals UP1 and DN1, UP2 and DN2, UP3 and DN3, or UP4 and DN4. Because the pair of signals UP_OUT and DN_OUT exists in each of a clock cycle, a blind condition does not exist.

In operation 730, charge pump 120 uses signals UP_OUT and DN_OUT to adjust the output current of charge pump 120 and thus the frequency of VCO 140.

A number of embodiments have been described. It will nevertheless be understood that various modifications may be made without departing from the spirit and scope of the disclosure.

For example, in some embodiments, a phase frequency detector circuit comprises an edge detector circuit, a plurality of phase frequency detector sub-circuits and a decision circuit. The edge detector circuit is configured to receive a first input signal and a second input signal. The decision circuit is configured to detect whether a blind condition exits based on outputs of the edge detector circuit and outputs of the plurality of phase frequency detector sub-circuits. Responsive to a result of the decision circuit, a corresponding frequency detector sub-circuit of the plurality of phase frequency detector sub-circuit is configured to provide signals for use in determining a phase difference between the first input signal and the second input signal.

For another example, in some embodiments, a method includes generating a first set of signals by a first phase frequency detector based on a first input signal, a second input signal, a first reset signal, and a second reset signal. A second set of signals is generated by a second phase frequency detector based on the first input signal, the second input signal, a third reset signal, and a fourth reset signal. A third set of signals, indicating a status of a blind condition of the first and second input signals, is generated by a decision circuit based on the first set of signals, the second set of signals, the first input signal, and the second input signal. The first reset signal, the second reset signal, the third reset signal, and the fourth reset signal are generated based on the third set of signals. A fourth set of signals indicating a phase difference between the first input signal and the second input signal is generated based on the first set of signals and the second set of signals.

In some embodiments, a phase frequency detector circuit includes an edge detector circuit, a first phase frequency detector sub-circuit, a second phase frequency detector sub-circuit, and a decision circuit. The edge detector circuit is configured to generate a first signal and a second signal based on a first input signal, and is configured to generate a third signal and a fourth signal based on a second input signal. The second signal is an inversed signal of the first signal, and the fourth signal is an inversed signal of the third signal. The first phase frequency detector sub-circuit is configured to generate a first set of output signals and a first reset signal based on the first signal, the third signal, and a set of blind condition signals, and is configured to generate a second set of output signals and a second reset signal based on the second signal, the fourth signal, and the set of blind condition signals. The second phase frequency detector sub-circuit is configured to generate a third set of output signals and a third reset signal based on the first signal, the fourth signal, and the set of blind condition signals, and is configured to generate a fourth set of output signals and a fourth reset signal based on the second signal, the third signal, and the set of blind condition signals. The decision circuit is configured to generate a first blind condition signal of the set of blind condition signals based on the first signal, the second signal, the third signal, the fourth signal, the first set of signals, the second set of signals, the first reset signal, or the second reset signal, and is configured to generate a second blind condition signal of the set of blind condition signals based on the first signal, the second signal, the third signal, the fourth signal, the third set of signals, the fourth set of signals, the third reset signal, or the fourth reset signal.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A phase frequency detector circuit comprising:
   an edge detector circuit;
   a plurality of phase frequency detector sub-circuits; and
   a decision circuit,
   wherein
   the edge detector circuit is configured to receive a first input signal and a second input signal;
   the decision circuit is configured to detect whether a blind condition exits based on output signals of the edge detector circuit and output signals of the plurality of phase frequency detector sub-circuits;
   responsive to a result of the decision circuit, a corresponding phase frequency detector sub-circuit of the plurality of phase frequency detector sub-circuits is configured to provide signals for use in determining a phase difference between the first input signal and the second input signal, a first phase frequency detector sub-circuit of the plurality of phase frequency detector sub-circuits is configured to generate a first output signal based on the first output signal of the output signals of the edge detector circuit, a second output signal based on the second output signal of the output signals of the edge detector circuit, a third output signal based on the third output signal of the output signals of the edge detector circuit, and a fourth output signal based on the fourth output signal of the output signals of the edge detector circuit; and a second phase frequency detector sub-circuit of the plurality of phase frequency detector sub-circuits is configured to generate a first output signal based on the third output signal of the output signals of the edge detector circuit, a second output signal based on the second output signal of the output signals of the edge detector circuit, a third output signal based on the first output signal of the output signals of the edge detector circuit, and a fourth output signal based on the fourth output signal of the output signals of the edge detector circuit.

2. The phase frequency detector circuit of claim 1, wherein
   the first output signal is a first division of the first input signal;
   the second output signal is a second division of the second input signal;
   the third output signal is an inverse logic of the first output signal; and
   the fourth output signal is an inverse logic of the second output signal.

3. The phase frequency detector circuit of claim 1, wherein at least one of the following conditions is met:
   the first phase frequency detector sub-circuit is configured to generate a first reset signal to reset the first output signal and the second output signal of the first phase frequency detector sub-circuit based on a first output signal of the decision circuit, the first output signal and the second output signal of the first phase frequency detector sub-circuit;
   the first phase frequency detector sub-circuit is configured to generate a second reset signal to reset the third output signal and the fourth output signal of the first phase frequency detector sub-circuit based on the first output signal of the decision circuit, the third output signal and the second output signal of the first phase frequency detector sub-circuit;
   the second phase frequency detector sub-circuit is configured to generate a third reset signal to reset the first output signal and the second output signal of the second phase frequency detector sub-circuit based on the first output signal of the decision circuit, a second output signal of the decision circuit, an inverse signal of the first output signal of the decision circuit, the first output signal and the second output signal of the second phase frequency detector sub-circuit; or
   the second phase frequency detector sub-circuit is configured to generate a fourth reset signal to reset the third output signal and the fourth output signal of the second phase frequency detector sub-circuit based on the first output signal of the decision circuit, the second output of the decision circuit, the inverse signal of the first output signal of the decision circuit, the third output signal and the fourth output signal of the second phase frequency detector sub-circuit.

4. The phase frequency detector circuit of claim 3, wherein
   the decision circuit is configured to generate the first output signal of the decision circuit and the inverse signal of the first output signal of the decision circuit based on the first output signal of the first phase frequency detector sub-circuit, the first reset signal, the second output signal of the first phase frequency detector sub-circuit, the first output signal of the output signals of the edge detector circuit, the second output signal of the output signals of the edge detector circuit, and the second output signal of the decision circuit; and
   the decision circuit is configured to generate the second output signal of the decision circuit based on the first output signal of the second phase frequency detector sub-circuit, the third reset signal, the second output signal of the second phase frequency detector sub-circuit, the third output signal of the output signals of the edge detector circuit, the second output signal of the output signals of the edge detector circuit, and the first output signal of the decision circuit.

5. The phase frequency detector circuit of claim 3, wherein
   the decision circuit is configured to generate the first output signal of the decision circuit and the inverse signal of the first output signal of the decision circuit based on the third output signal of the first phase frequency detector sub-circuit, the second reset signal, the fourth output signal of the first phase frequency detector sub-circuit, the third output signal of the output signals of the edge detector circuit, the fourth output signal of the output signals of the edge detector circuit, and the second output signal of the decision circuit; and the decision circuit is configured to generate the second output signal of the decision circuit based on the third output signal of the second phase frequency detector sub-circuit, the fourth reset signal, the fourth output signal of the second phase frequency detector sub-circuit, the first output signal of the output signals of the edge detector circuit, the fourth output signal of the output signals of the edge detector circuit, and the first output signal of the decision circuit.

6. The phase frequency detector circuit of claim 1, wherein a first phase frequency detector sub-circuit of the plurality of phase frequency detector sub-circuits is configured to generate a first output signal, a second output signal, a third output signal, and a fourth output signal of the first phase frequency detector sub-circuit based on a first output signal of the decision circuit; and a second phase frequency detector sub-circuit of the plurality of phase frequency detector sub-circuits is configured to generate a first output signal, a second output signal, a third output signal, and a fourth output signal of the second phase frequency detector sub-circuit based on an inverse signal of the first output signal of the decision circuit and/or a second output signal of the decision circuit.

7. The phase frequency detector circuit of claim 6, wherein the decision circuit is configured to generate the first output signal and the second output signal of the decision circuit at a first logical value when both the first output signal and the second output signal of the decision circuit are at a second logical value different from the first logical value.

8. A method comprising:

generating a first set of signals by a first phase frequency detector based on a first input signal, a second input signal, a first reset signal, and a second reset signal;

generating a second set of signals by a second phase frequency detector based on the first input signal, the second input signal, a third reset signal, and a fourth reset signal;

generating a third set of signals, indicating a status of a blind condition of the first and second input signals, by a decision circuit based on the first set of signals, the second set of signals, the first input signal, and the second input signal;

generating the first reset signal, the second reset signal, the third reset signal, and the fourth reset signal based on the third set of signals; and generating a fourth set of signals indicating a phase difference between the first input signal and the second input signal based on the first set of signals and the second set of signals.

9. The method of claim 8, further comprising:

generating a first divided-by-two signal and a second divided-by-two signal based on the first input signal, the second divided-by-two signal being an inversed signal of the first divided-by-two signal; and generating a third divided-by-two signal and a fourth divided-by-two signal based on the second input signal, the fourth divided-by-two signal being an inversed signal of the third divided-by-two signal.

10. The method of claim 9, wherein the generating the first set of signals comprises:

generating a first edge of a first signal based on a first edge of the third divided-by-two signal;

generating a first edge of a second signal based on a first edge of the first divided-by-two signal;

generating a second edge of the first signal and a second edge of the second signal based on the first reset signal;

generating the first reset signal based on logic levels of the first and the second signals and the third set of signals;

generating a first edge of a third signal based on a first edge of the fourth divided-by-two signal;

generating a first edge of a fourth signal based on a first edge of the second divided-by-two signal;

generating a second edge of the third signal and a second edge of the fourth signal based on the second reset signal; and generating the second reset signal based on logic levels of the third and the fourth signals and the third set of signals.

11. The method of claim 9, wherein the generating the second set of signals comprises:

generating a first edge of a fifth signal based on a first edge of the fourth divided-by-two signal;

generating a first edge of a sixth signal based on a first edge of the first divided-by-two signal;

generating a second edge of the fifth signal and a second edge of the sixth signal based on the third reset signal;

generating the third reset signal based on logic levels of the sixth and the fifth signals and the third set of signals;

generating a first edge of a seventh signal based on a first edge of the third divided-by-two signal;

generating a first edge of a eighth signal based on a first edge of the second divided-by-two signal;

generating a second edge of the seventh signal and a second edge of the eighth signal based on the fourth reset signal; and generating the fourth reset signal based on logic levels of the seventh and the eighth signals and the third set of signals.

12. The method of claim 9, wherein the generating the first set of signals comprises:

generating a first signal based on a first edge of the third divided-by-two signal and the first reset signal;

generating a second signal based on a first edge of the first divided-by-two signal and the first reset signal;

generating a third signal based on a first edge of the fourth divided-by-two signal and the second reset signal; and generating a fourth signal based on a first edge of the second divided-by-two signal and the second reset signal; and the generating the second set of signals comprises:

generating a fifth signal based on a first edge of the fourth divided-by-two signal and the third reset signal;

generating a sixth signal based on a first edge of the first divided-by-two signal and the third reset signal;

generating a seventh signal based on a first edge of the third divided-by-two signal and the fourth reset signal; and generating a eighth signal based on a first edge of the second divided-by-two signal and the fourth reset signal.

13. The method of claim 12, wherein the generating the third set of signals comprises generating a signal of the third set of signals indicating one or more of:

a first blind condition of the first edge of the third divided-by-two signal with respect to the first signal or the first reset signal;
a second blind condition of the first edge of the first divided-by-two signal with respect to the second signal or the first reset signal;
a third blind condition of the first edge of the fourth divided-by-two signal with respect to the third signal or the second reset signal; or
a fourth blind condition of the first edge of the second divided-by-two signal with respect to the fourth signal or the second reset signal.

14. The method of claim 12, wherein the generating the third set of signals comprises generating a signal of the third set of signals indicating one or more of:
a first blind condition of the first edge of the fourth divided-by-two signal with respect to the fifth signal or the third reset signal;
a second blind condition of the first edge of the first divided-by-two signal with respect to the sixth signal or the third reset signal;
a third blind condition of the first edge of the third divided-by-two signal with respect to the seventh signal or the fourth reset signal; or
a fourth blind condition of the first edge of the second divided-by-two signal with respect to the eighth signal or the fourth reset signal.

15. The method of claim 12, wherein the generating the fourth set of signals comprises:
generating a first output signal of the fourth set of signals based on the first, third, fifth, and seventh signals; and
generating a second output signal of the fourth set of signals based on the second, fourth, sixth, and eighth signals.

16. The method of claim 12, wherein the generating the fourth set of signals comprises:
generating a first output signal of the fourth set of signals by performing an OR operation based on the first, third, fifth, and seventh signals; and
generating a second output signal of the fourth set of signals by performing an OR operation based on the second, fourth, sixth, and eighth signals.

17. A phase frequency detector circuit comprising:
an edge detector circuit configured to
generate a first signal and a second signal based on a first input signal, the second signal being an inversed signal of the first signal; and
generate a third signal and a fourth signal based on a second input signal, the fourth signal being an inversed signal of the third signal;
a first phase frequency detector sub-circuit configured to
generate a first set of output signals and a first reset signal based on the first signal, the third signal, and a set of blind condition signals; and
generate a second set of output signals and a second reset signal based on the second signal, the fourth signal, and the set of blind condition signals;
a second phase frequency detector sub-circuit configured to
generate a third set of output signals and a third reset signal based on the first signal, the fourth signal, and the set of blind condition signals; and
generate a fourth set of output signals and a fourth reset signal based on the second signal, the third signal, and the set of blind condition signals; and
a decision circuit configured to
generate a first blind condition signal of the set of blind condition signals based on the first signal, the second signal, the third signal, the fourth signal, the first set of signals, the second set of signals, the first reset signal, or the second reset signal; and
generate a second blind condition signal of the set of blind condition signals based on the first signal, the second signal, the third signal, the fourth signal, the third set of signals, the fourth set of signals, the third reset signal, or the fourth reset signal.

18. The phase frequency detector circuit of claim 17, wherein
the first and second reset signals are set to a logic high level when the first blind condition signal is at the logic high level; and
the third and fourth reset signals are set to the logic high level when the first blind condition signal is at a logic low level or when the second blind signal is at the logic high level.

19. The phase frequency detector circuit of claim 17, further comprising a phase frequency detector output circuit configured to generate a set of phase frequency output signals based on the first set of output signals, the second set of output signals, the third set of output signals, and the fourth set of output signals.

20. The phase frequency detector circuit of claim 19, wherein
the first set of output signals comprises a first UP signal and a first DN signal;
the second set of output signals comprises a second UP signal and a second DN signal;
the third set of output signals comprises a third UP signal and a third DN signal;
the fourth set of output signals comprises a fourth UP signal and a fourth DN signal;
the set of phase frequency output signals comprises an output UP signal and an output DN signal; and
the phase frequency detector output circuit comprises:
a first OR gate configured to receive the first, second, third, and fourth UP signals and generate the output UP signal; and
a second OR gate configured to receive the first, second, third, and fourth DN signals and generate the output DN signal.

* * * * *